(12) United States Patent
Nakamura

(10) Patent No.: US 7,384,153 B2
(45) Date of Patent: Jun. 10, 2008

(54) LIGHT SOURCE DEVICE AND PROJECTOR

(75) Inventor: Norio Nakamura, Nagano (JP)

(73) Assignee: Seiko Epson Corporation (JP)

(*) Notice: Subject to any disclaimer, the term of this patent is extended or adjusted under 35 U.S.C. 154(b) by 136 days.

(21) Appl. No.: 11/142,876

(22) Filed: Jun. 1, 2005

(65) Prior Publication Data

US 2005/0270493 A1 Dec. 8, 2005

(30) Foreign Application Priority Data

Jun. 2, 2004 (JP) ............................. 2004-164497

(51) Int. Cl.
- G03B 21/18 (2006.01)
- G03B 21/26 (2006.01)
- F21V 29/00 (2006.01)
- H01L 33/00 (2006.01)
- G02F 1/00 (2006.01)
- H04N 5/74 (2006.01)
- H04N 5/70 (2006.01)

(52) U.S. Cl. .................. 353/56; 353/31; 362/294; 362/555; 362/800; 348/750; 348/757; 348/758; 348/801

(58) Field of Classification Search .............. 353/31, 353/52, 54, 56; 362/294, 580, 547, 264, 362/345, 373, 555, 561, 612, 800; 348/748, 348/750, 757, 758, 801; 349/161; 257/79–100
See application file for complete search history.

(56) References Cited

U.S. PATENT DOCUMENTS

| | | | |
|---|---|---|---|
| 6,281,949 B1 | 8/2001 | Matsui et al. | 348/750 |
| 6,330,039 B2 | 12/2001 | Matsui et al. | 348/742 |
| 6,573,537 B1* | 6/2003 | Steigerwald et al. | 257/103 |
| 7,072,096 B2* | 7/2006 | Holman et al. | 359/298 |
| 2003/0153108 A1* | 8/2003 | Durocher et al. | 438/26 |
| 2005/0174544 A1* | 8/2005 | Mazzochette | 353/69 |

FOREIGN PATENT DOCUMENTS

| | | |
|---|---|---|
| JP | 04-048662 | 2/1992 |
| JP | 10-326080 | 12/1998 |
| JP | 2000-277812 | 10/2000 |
| JP | 2002-190497 | 7/2002 |
| JP | 2003-008071 | 1/2003 |

* cited by examiner

*Primary Examiner*—Rochelle-Ann Blackman
(74) *Attorney, Agent, or Firm*—Harness, Dickey & Pierce, P.L.C.

(57) ABSTRACT

A light source device is provided comprising: a light-emitting element; a support member having the light-emitting element flip chip mounted thereto; and a thermally conductive filling agent between the light-emitting element and the support member. By injecting the filling agent between the light-emitting element and the support member, the thermal conduction is supplemented by the filling agent. As such, heat generated by the light-emitting element can be efficiently removed outside the light source device.

11 Claims, 5 Drawing Sheets

LIGHT SOURCE DEVICE AND PROJECTOR

RELATED APPLICATIONS

This application claims priority to Japanese Patent Application No. 2004-164497 filed Jun. 2, 2004 which is hereby expressly incorporated by reference herein in its entirety.

BACKGROUND

1. Technical Field

The present invention relates to a light source device with a light-emitting element such as a light-emitting diode functioning as a light source and formed on a substrate by a mounting technique including a flip chip technique and so on, and a projector therewith.

2. Related Art

A known technique for attaching an LED (light-emitting diode) chip like a flip chip uses ultrasonic welding and a metal bump (JP-A No. 2003-8071).

Furthermore, in flip-chip mounting of a semiconductor chip and so on, in order to avoid damaging a solder joint due to thermal stress caused by a difference in the thermal expansion coefficients, it is known to fill a sealing resin containing filler between continuation and connection solder balls (JP-A No. 2002-190497).

However, organic adhesives that are generally used as filler are so low in the thermal conductivity that heat cannot be effectively conducted, and in addition to this, there is a limitation in a cross-sectional area of a solder ball that forms a flip chip. Accordingly, the thermal conductivity is not very large. On the other hand, due to the higher brightness of recent LEDs, the heat generated due to an LED element is increasing.

In this connection, the invention intends, by improving the thermal conductivity between a solid light-emitting element such as an LED and a mounting substrate in a mounting technique including the flip-chip, to provide a light source device having a solid light-emitting element having sufficient brightness and a projector with such a light source.

SUMMARY

In order to solve the problems of the invention, a light source device involving the invention includes (a) a light-emitting element emitting light in a predetermined wavelength region; (b) a support member supporting the light-emitting element via a mounting technique including a flip chip; and (c) a thermally conductive filling agent injected between the light-emitting element and the support member. Here, the light-emitting element includes, other than a case where it is an element itself such as an LED, a case where it is an electronic component manufactured by packaging the LED. The flip chip mounting is a mounting technology where a surface electrode of a semiconductor element and so on and an electrode of a substrate directly face one another in alignment, followed by joining by applying heat and pressure. For example, a technique of joining between electrodes with a solder ball may be used. In this case, as the above-described filling agent, for example, one that injects a thermally conductive material in a gap between the joining members such as the solder ball can be considered.

In this case, since a filling agent with an excellent thermal conductivity lies between the light-emitting element and the support member, heat generated from the light-emitting element is efficiently conducted to the support member that is a mounting substrate. Accordingly, when it is used as a light source light, a light source device that is not likely to over-heat, and has sufficient and stable emission brightness can be obtained.

Furthermore, in a specific mode of the invention, the filling agent in the light source device is formed of an insulating material. In this case, since the filling material is thermally conductive but not electrically conductive, there is no adverse affect such as short circuiting of a circuit on a mounting substrate in the flip chip mounting.

As another more specific mode involving the invention, the insulating material includes solid particles that have a thermal conductivity larger than that of air. In this case, when the solid particles with a larger thermal conductivity are selected, it becomes possible to carry out more effective thermal conduction. Accordingly, a cooling effect of the light-emitting element can be improved.

As still another more specific mode involving the invention, the insulating material is an adhesive that contains a ceramic filler as the solid particles. In this case, it is possible to use ceramics that have large thermal conductivity and, the ceramic itself is generally an insulating material. Accordingly, a material that does not cause an adverse affect such as short circuiting of a circuit on a mounting substrate due to the flip-chip mounting can be obtained. In addition to this, due to the adhesion properties of the insulating material, the light-emitting element and the support substrate can be solidly joined. Furthermore, it is preferable that the filler has a thermal conductivity larger than that of the adhesive itself.

As another specific mode involving the invention, the insulating material is one that can be solidified. In this case, without using another means for fixing the insulating material, a light-emitting element can be assuredly fixed on the support member.

In another light source device involving the invention, the filling agent is formed of an electrically conductive material and an insulating member that insulates between electrodes of the light-emitting element is further provided. In this case, when the electrically conductive material has large thermal conductivity, efficient thermal conduction can be realized. In addition to this, since electrodes are isolated with the insulating member, even when the electrically conductive material is used as the filling agent, there is no adverse affect such as short circuiting of a circuit on a mounting substrate due to the flip-chip mounting.

Furthermore, as a further specific mode involving the invention, the electrically conductive material includes solid particles having electrical conductivity. In this case, it is possible to choose solid particles with desired electrical conductivity and, in general, the electrically conductive substance has high thermal conductivity. Accordingly, it is possible to further improve the thermal conduction efficiency.

As a still further specific mode involving the invention, the conductive material is any one of a metal paste, an adhesive containing metal filler as solid particles and an anisotropically electrically conductive elastic body. In this case, as the metal paste, one that has both large electrical conductivity and adhesive force can be selected. Furthermore, by selecting a material of the metal filler that is the solid particles, it is possible to obtain large electrical as well as thermal conductivity. Similarly, of the anisotropically electrically conductive elastic body as well, by selecting a material, it becomes possible to obtain large electrical as well as thermal conductivity. In addition to this, due to the nature of the anisotropically electrically conductive elastic body, it is characteristic in an electrically conductive direction and thereby the anisotropically electrically conductive elastic body itself may play the role of an insulating member.

Furthermore, as another specific mode involving the invention, in the light source device, the light-emitting element is a light-emitting diode. In this case, the light source device can have sufficient brightness as illuminating light for, such as, a projector, and a color of the illuminating light can be freely set.

Still furthermore, a first projector involving the invention has (a) the abovementioned light source device that emits illuminating light, (b) a light modulator that is illuminated by illuminating light emitted from the light source device, and (c) a projection optical system that projects image light from the light modulator.

When the light source device according to the invention that has the features mentioned above is used, the first projector can inhibit the light source device from being used in an over-heated state. Accordingly, it can always project a high quality image with stable brightness.

Furthermore, a second projector involving the invention has (a) the abovementioned light source devices disposed for each color light that emit illuminating light of the respective colors, (b) light modulators for the respective colors that are respectively illuminated by illuminating light of the respective colors, (c) a light synthesizing member that synthesizes image light of color light from the light modulators of the respective colors, and (d) a projection optical system that projects image light undergone the light synthesizing member.

By use of the light source device according to the invention that has the features mentioned above, the second projector can inhibit the light source device from being used in an over-heated state. Accordingly, it can always project a high quality image with stable brightness.

DETAILED DESCRIPTION

The First Embodiment

Figure 1:
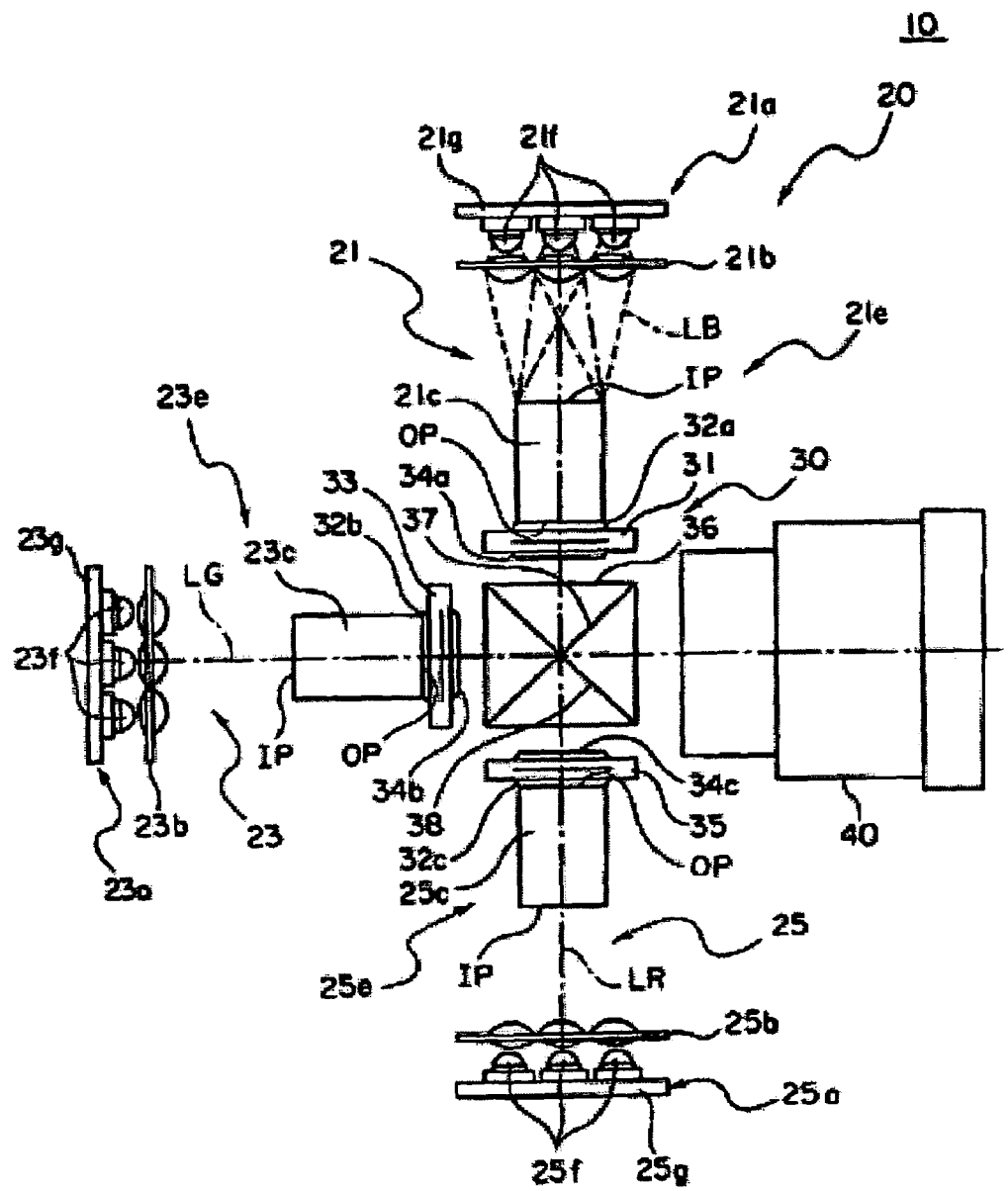
FIG. 1 is a block diagram of a projector having a light source device involving a first embodiment.

FIG. 1 is a block diagram of a projector 10 that has a light source device involving the invention. The projector 10 has a light source device 20, an image formation unit 30, and a projection lens 40. Here, the light source device 20 has a blue light source device 21, a green light source device 23, and a red light source device 25. The image formation unit 30 has polarizing filters 32a, 32b, 32c, 34a, 34b, and 34c that control a direction of polarization; three liquid crystal light bulbs 31, 33, and 35 that are light transmissive light modulators; and a cross dichroic prism 36 that is a light synthesizing member.

The blue light source device 21 has a blue light source unit 21a and an illuminating light formation optical system 21e. Among these, the blue light source unit 21a is manufactured by mounting a plurality of LED packages 21f that are electronic parts each incorporating an LED that is a solid light-emitting element on a circuit board 21g that is a support member thereof in a proper two-dimensional arrangement according to a flip-chip mounting. A detailed structure of the flip-chip mounting of the LED package 21f and the circuit board 21g will be described later with reference to FIG. 2. The illuminating light formation optical system 21e includes a condenser lens array 21b in which in front of each of the LED packages 21f a beam reforming lens element is individually disposed and a rod integrator 21c that is light homogenization means. Each of the LED packages 21f respectively generates blue light LB that is included in the category of blue of three primary colors. The blue light LB that is taken out of the LED package 21f goes through the condenser lens array 21b and then enters an incident edge, that is, an incident port IP, of the rod integrator 21c. At this time, blue light LB from each of the LED packages 21f is, by each of the lens elements that constitute the condenser lens array 21b, appropriately dispersed and formed into a beam that has an elliptic or rectangular cross section and is focused at a predetermined position. That is, blue light LB from each of the LED packages 21f is gathered as a whole at a rectangular incident port IP disposed to the rod integrator 21c and enters the incident port IP without omission in an overlaying state. Blue light LB gone through the rod integrator 21c and emitted from an exit port OP that is an exit edge thereof enters, through the polarizing filter 32a of the image formation unit 30 that is placed facing the exit port OP, the liquid-crystal light bulb for blue light 31. Thereby, illuminating light of homogenous blue light LB is formed and it can homogeneously illuminate a region to be illuminated on the liquid-crystal light bulb 31.

Furthermore, of green light LG and red light LR, according to the similar function, homogeneous illuminating light is formed. In other words, firstly, the green light source device 23 has a green light source unit 23a and an illuminating light formation optical system 23e. The former green light source unit 23a has a circuit board 23g and the LED packages 23f. Furthermore, the latter illuminating light formation optical system 23e is made of a condenser lens array 23b and a rod integrator 23c having an incident port IP and an output port OP, each of which has a function same as that of the illuminating light formation optical system 21e. With such a green light source device 23, illuminating light of homogenous green light LG is formed and can homogeneously illuminate a region to be illuminated on the liquid-crystal light bulb 33. Furthermore, in a similar fashion, the red light source device 25 has a red light source unit 25a and an illuminating light formation optical system 25e. The former red light source unit 25a has a circuit board 25g and the LED packages 25f. The latter illuminating light formation optical system 25e is made of a condenser lens array 25b and a rod integrator 25c having an incident port IP and an exit port OP, each of which has a function same as that of the illuminating light formation optical system 21e. With such a red light source device 25, illuminating light of homogenous red light LR is formed and can illuminate a region to be illuminated on the liquid crystal light bulb 35.

Each of the liquid crystal light bulbs 31, 33 and 35 is a light modulator for modulating a spatial intensity distribution of incident illuminating light. Color light LB, LG and LR of three colors incident on the respective liquid crystal light bulbs 31, 33 and 35, in accordance with drive signals or image signals inputted as electrical signals into each of the liquid crystal light bulbs 31, 33 and 35, is controlled for a state of polarization for each pixel unit. At this time, while each of the polarizing filters 32a, 32b and 32c controls a direction of polarization of illuminating light incident on each of the liquid crystal light bulbs 31, 33 and 35, each of the polarizing filters 34a, 34b and 34c takes out modulated light of a predetermined direction of polarization from color light LB, LG, LR emitted from each of the liquid crystal light bulbs 31, 33 and 35.

A cross dichroic prism 36 incorporates in an orthogonal state a dielectric multilayer film 37 for reflecting the red light LR and a dielectric multilayer film 38 for reflecting the blue light LB. The cross dichroic prism 36 reflects the red light LR from the liquid crystal light bulb 35 with the dielectric multilayer film 37 to emit toward a right side to a traveling direction, straightly emits the green light LG from the liquid crystal light bulb 33 through the dielectric multilayer films 37 and 38, and reflects the blue light LB from the liquid crystal light bulb 31 by the dielectric multilayer film 38 to emit toward a left side to a traveling direction. Synthesized color light that is synthesized by the cross dichroic prism 36 is projected by a projection lens 40 that is a projection optical system on a screen that is not shown in the drawing, and thereby a projected image is formed on the screen.

Figure 2:
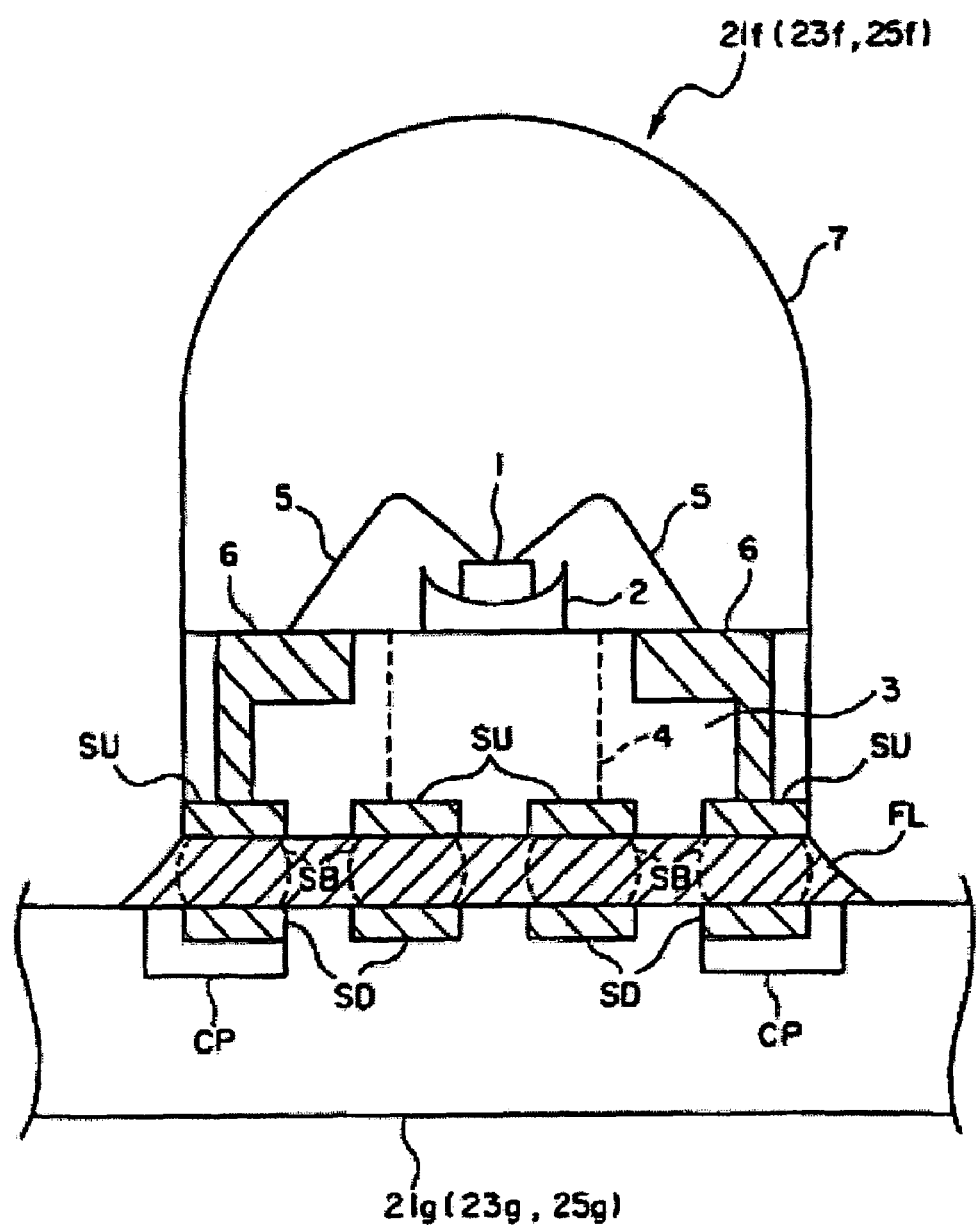
FIG. 2 is an expanded sectional view for explaining a state where an LED package of FIG. 1 is mounted.

FIG. 2 is an expanded sectional view describing, in a light source unit 21a (23a, 25a) according to the embodiment, a structure of the LED package 21f (23f, 25f) and a state where the LED package 21f (23f, 25f) is flip chip mounted on a circuit board 21g (23g, 25g). Here, the blue light source unit 21a is mainly described. However, for the green light source unit 23a and the red light source unit 25a as well, the situations are same. As mentioned above, the blue light source unit 21a has a plurality of the LED packages 21f and the circuit board 21g that is a target on which the LEDs are mounted in a proper two-dimensional arrangement due to solder ball SB joining. The LED packages 21f each have an LED element 1, a reflection mirror 2, a support substrate 3, a heat slag 4, bonding wires 5, electrodes 6, and a plastic mold 7. The LED element 1 is a light-emitting element body that generates light in a wavelength region of blue light, and the mirror 2 reflects light emitted by the LED element 1 frontward. The support substrate 3 supports the LED element 1 and the mirror 2, is joined onto the circuit board 21g that is a mounting substrate with the solder balls SB, and incorporates the heat slag 4 that conducts heat from the LED element 1 to the circuit board 21g. The bonding wires 5 form a wiring of the LED element 1 and are joined to upper pads of the electrodes 6 buried in the support substrate 3. Lower portions of the electrodes 6 are mounted on a circuit pattern CP on the circuit board 21g with the solder balls SB. The plastic mold 7 covers an entirety of the LED package 21f and has light transmittance.

In the embodiment, the support substrate 3 and so on have joining portions SU that are joining surfaces with the solder balls SB, and similarly, the circuit patterns CP have joining portions SD that are joining surfaces with the solder balls SB. Since the joining portions SU and SD have a diameter substantially same as that of the solder ball SB, these can be stably joined. Thereby, the LED package 21f is assuredly fixed on the circuit board 21g. Furthermore, in gaps of the joining portion between the LED package 21f and the circuit board 21g, heat dissipating filling material FL is injected.

In what follows, a function of the LED package 21f will be described. Due to an electric current supplied from the circuit pattern CP through the electrodes 6 and the bonding wires 5, the LED element 1 radially emits the blue light LB that works as light source light. At this juncture, the blue light LB emitted backward is reflected frontward by the mirror 2 and thereby the blue light LB is utilized economically. Blue light LB emitted forward goes through the plastic mold 7 and is emitted outside as light source light of the blue light source unit 21a. At this time, heat generated by the LED element 1 is conducted to the heat slag 4 which is high in thermal conductivity. Generally, heat conducted to the heat slag 4 is further conducted through the solder balls SB to the circuit board 21g. However, in the embodiment, since the filling material FL is injected in the gaps of the joining portion, the thermal conduction is carried out not only by the solder balls SB but also by the filling material FL. Accordingly, heat generated by the LED element 1 can be efficiently removed outside of the light source device.

As the filling material FL of the gaps between the solder balls SB, firstly, one in which filler made of insulating particles such as ceramic powder is blended with a silicon base adhesive can be considered. When, as a raw material of ceramic powder, one high in the thermal conductivity is used, heat within the LED package 21f generated by the LED element 1 can be effectively conducted toward the circuit board 21g. Furthermore, since the silicon base adhesive is used in this case, the filling material FL is solidified after being injected into the place in question. Thereby, the LED element 1 can be assuredly fixed on the circuit board 21g. When rubber or gel-like substance is used as the filling material FL, similar solidification is possible. Furthermore, as particles used as filler, other than the ceramic powder, as a material that is an insulating material and high in the thermal conductivity, for instance, diamond particles and so on can be cited. So long as the insulating properties of the filling material FL can be maintained, metal powder can be used as the filler.

Furthermore, other than this, as the filling material FL, one in which filler made of insulating particles such as ceramic powder is blended in silicon oil can be cited. In this case, in order to inhibit the silicon oil from leaking, the filling material FL has to be held in a liquid tight state. For example, when a seal member is formed around the filling material FL, such a holding can be realized. Since the silicon oil is excellent in the heat resistance and thermal conductivity, larger heat dissipation properties can be obtained. Furthermore, since it is in a liquid state, the influence affected on the solder joint by the difference of thermal expansion between the solder balls SB and the filling material FL can be suppressed. In this case as well, it is possible to use diamond particles and so on as the filler.

The embodiment intends to, in the mounting substrate where the LED that is a light-emitting element is flip-chip mounted, efficiently conduct heat generated by the LED element 1 through the heat slag 4 to the LED packages 21f (23f, 25f). For this purpose, in the gaps between the solder balls SB that join the LED package 21f (23f, 25f) and the circuit board 21g on which the package is mounted, the filling material FL with the thermal conductivity is injected. When a material with a large thermal conductivity is used as the filling material FL, not only the solder balls SB but also the filling material FL conduct heat and, accordingly, heat generated from the LED element 1 can be more effectively exhausted. When light emitted from such LED packages is used as light source light, a light source device that is free from concern of overheating can be obtained. In addition to this, when a projector is provided with the light source device, it is possible to always project a high image quality image with stable brightness.

Figure 3:
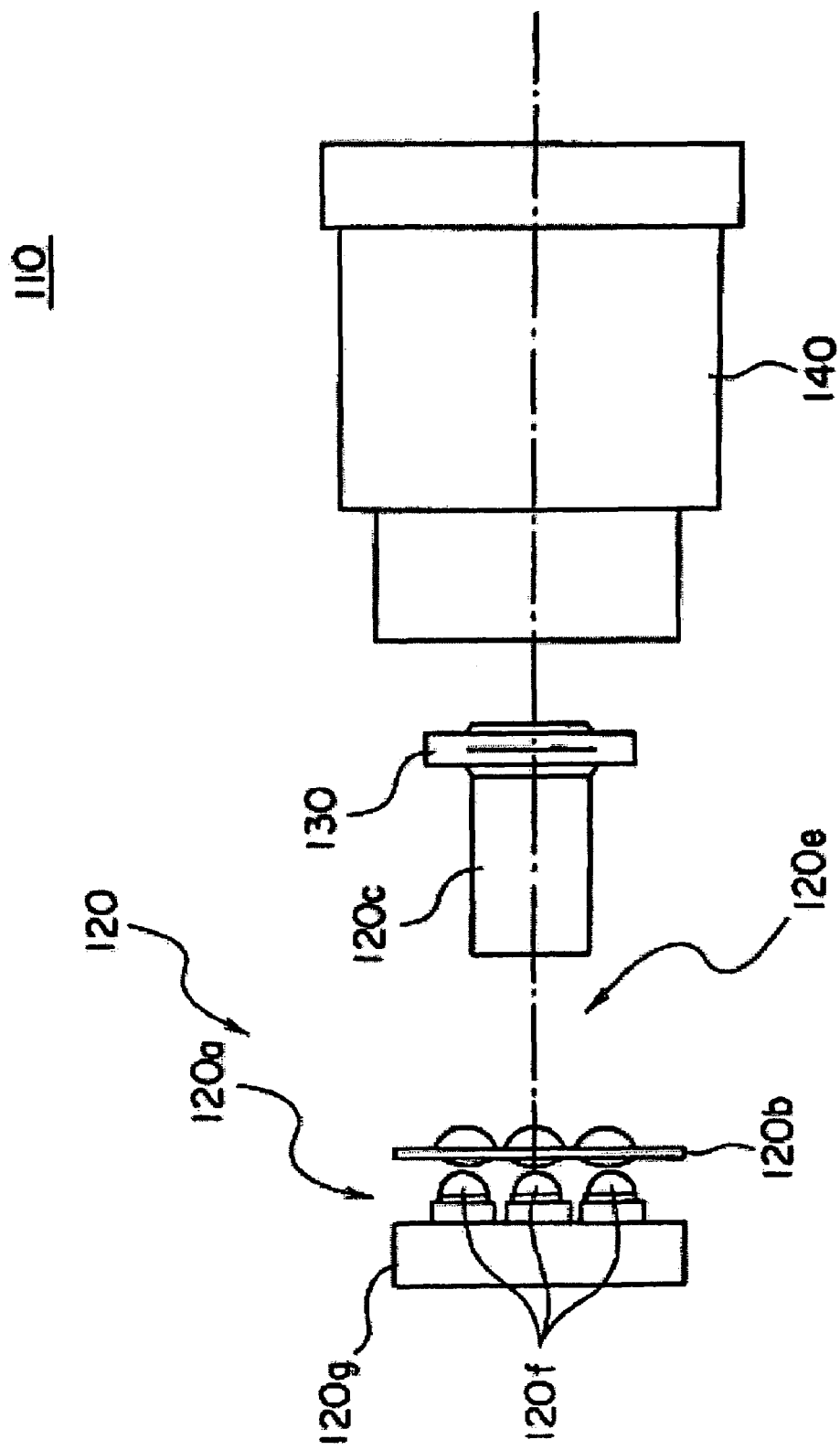
FIG. 3 is a block diagram showing a structure of a single panel projector that is a modification example of the projector shown in FIG. 1.

FIG. 3 is a block diagram showing a structure of a single plate projector 110 that is a modification example of the projector shown in FIG. 1. In what follows, except for the LED packages 120f, since ones having the same name have the same structure and same function as that of the projector 10 mentioned above, the explanation thereof is omitted. The projector 110 has a light source device 120, a liquid crystal light bulb 130, and a projection lens 140. The light source device 120 has a light source unit 120a and an illuminating light formation optical system 120e. Furthermore, the light source unit 120a has a plurality of LED packages 120f and a circuit board 120g on which the LED packages are mounted. Still furthermore, the illuminating light formation optical system 120e is made of a condenser lens array 120b and a rod integrator 120c.

As the LED packages 120f, firstly, one where an LED package 120f incorporates a plurality of different kinds of LED elements such as three ELD elements of blue light, green light, and red light can be cited. In this case, by controlling the elements in question to emit white light, a color image can be projected. Other than this, a case where an LED package has a white LED element, or a case where in a plurality of LED packages 120f, LED elements respectively emitting different color light are placed according to a definite rule can be cited.

Since the projector 150 is a single plate type, there is no need for synthesizing image light and, when image light obtained by the liquid crystal light bulb 130 is directly projected as it is by the projection lens 140, a color projection image can be formed.

The Second Embodiment

In the first embodiment, an insulating material is used as a material for a filling material FL. However, in the present embodiment, a case where an electrically conductive material is used, and furthermore, an insulating member is used to insulate between the electrodes will be considered.

In the case where the light source device in the embodiment is applied to each of the projectors shown in FIGS. 1 and 3, except for a mounting method of the package, a structure which is the same as that in the first embodiment can be used. Accordingly, the explanation will be omitted except for portions relating to a mounting method.

Figure 4:
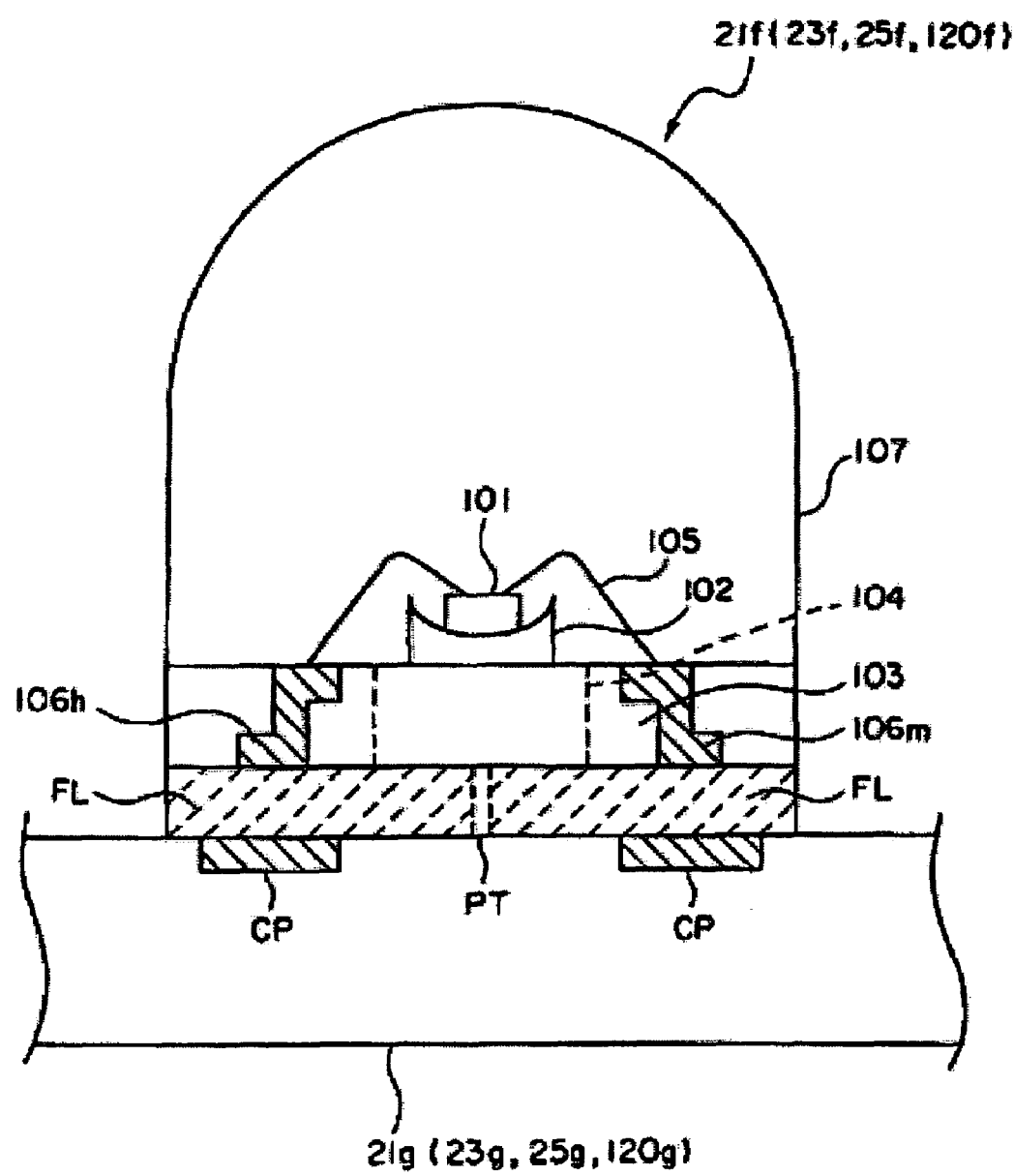
FIG. 4 is an expanded sectional view for explaining an LED package of a light source device involving a second embodiment.

FIG. 4 is an expanded sectional view for explaining, in each of the light source units 21a (23a, 25a and 120a) in the embodiment, a structure of the LED package 21f (23f, 25f and 120f) and a state where the LED package 21f (23f, 25f and 120f) is mounted on the circuit board 21g (23g, 25g and 120g). Here, the LED package 21f that a fundamental blue light source unit 21a has will be explained, and the same explanation can be applied to a green light source unit 23a, a red light source unit 25a and a light source unit 120a.

Similarly to the first embodiment, for example, the blue light source unit 21a has a plurality of LED packages 21f, a circuit board 21g that is a mounting substrate on which the LED packages are mounted by joining through a filling material FL having the electrical conductivity in a proper two-dimensional arrangement, and a partition PT that is an insulating member separating the filling material FL for each electrode. Each of the LED packages 21f has an LED element 101, a reflection mirror 102, a support substrate 103, a heat slag 104, bonding wires 105, electrodes 106m and 106h, and a plastic mold 107. The LED element 101 is a light-emitting element body that emits light within the wavelength region of blue light, and the mirror 102 reflects light emitted by the LED element 101 frontward. The support substrate 103 supports the LED element 101 and the mirror 102, is mounted on the circuit board 21g through the filling material FL, and incorporates the heat slag 104 that conducts heat from the LED element 101 to the circuit board 21g. The bonding wires 105 form a wiring of the LED element 101 and are joined to upper portions of the electrodes 106m and 106h. Lower portions of the electrodes 106m and 106h are joined through the filling material FL to a circuit pattern CP on the circuit board 21g. The plastic mold 107 covers an entirety of the LED package 21f and has light transmittance.

In the LED package 21f of the embodiment, the support substrate 103 and the electrodes 106m and 106h are adhered through the filling material FL to the circuit board 21g and fixed thereto. The filling material FL is separated by the partition PT. The partition PT electrically insulates the electrode 106m from the electrode 106h as well.

Figure 5:
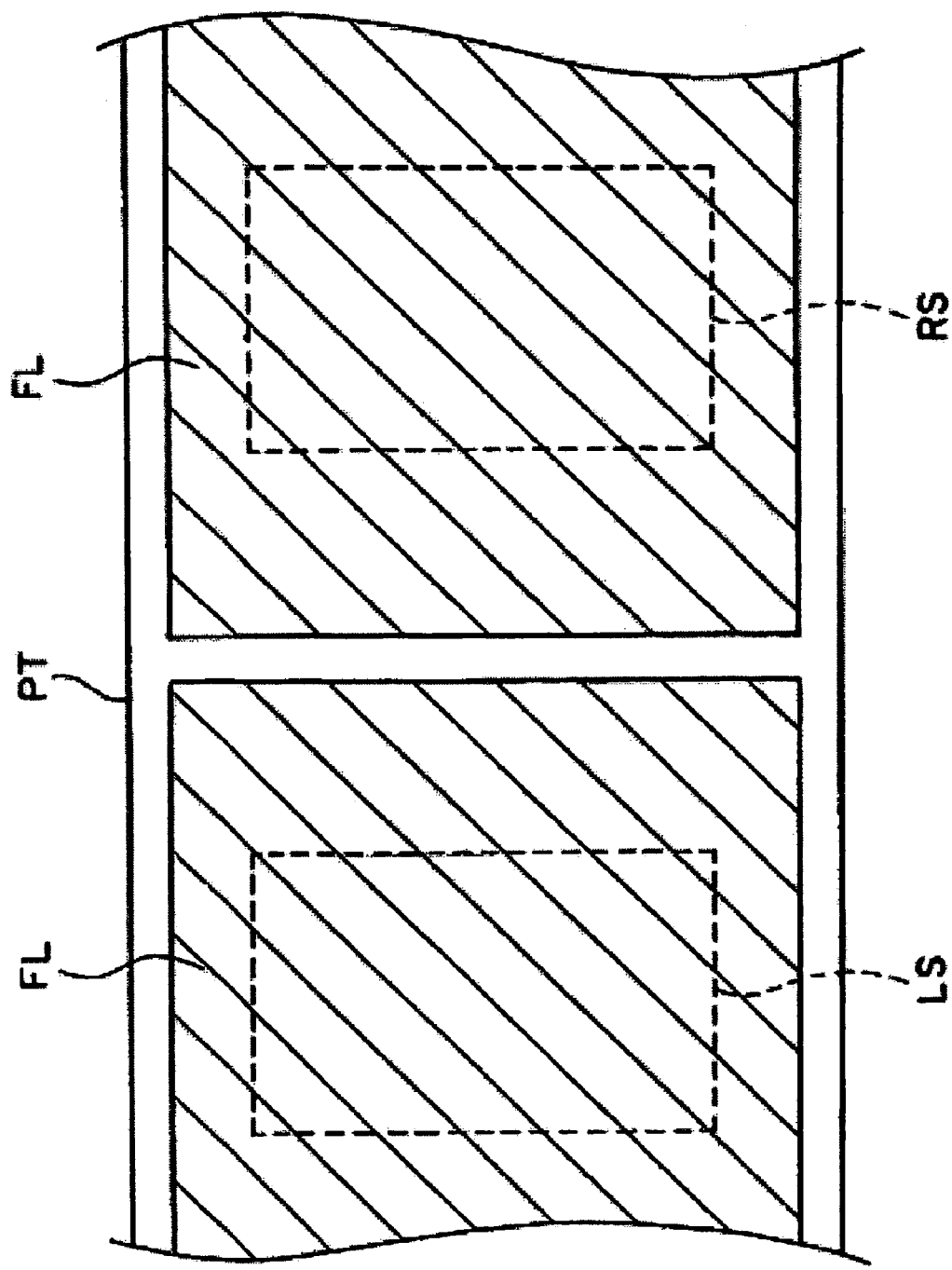
FIG. 5 is a plan view for explaining a mounting method involving the second embodiment.

FIG. 5 is a plan view for better understanding a role of the abovementioned partition PT in the mounting method involving the embodiment. The partition PT has, for example, an H-shape as shown in FIG. 5, and thereby, the filling material FL exists separated in two regions on both right and left sides. Within the respective regions, an electrode contact surface RS of the electrode 106m and an electrode contact surface LS of the electrode 106h (shown with dashed lines in the drawing) exist. Thereby, the electrode 106m is insulated from the electrode 106h. In addition to this, the partition PT also separates the filling the circuit board 21g (not shown in the drawing). Accordingly, the filling material FL does not cause an adverse effect such as short circuiting of the circuit board 21g.

As the filling material FL that is between the LED package 21f and the circuit board 21g, firstly, a silver paste can be cited. In this case, since the adhesive property of the silver paste is utilized, it becomes possible to carry out mounting without a process where heat is applied such as the soldering. Alternatively, an adhesive containing copper filler or an anisotropically electrically conductive rubber can be used as the filling material FL.

In the embodiment, since the filling material FL solidifies or becomes adhesive, the LED packages 21f are adhered and fixed on the circuit board 21g. However, like in the first embodiment, when a method where the filling material FL is maintained liquid-tightly and the LED package 21f can be fixed on the circuit board 21g is used, as the filling material FL, a material that is not solidified can be used. Such a fixing method can be achieved by providing the partition with the function in question.

The invention claimed is:

1. A light source device, comprising:
    a light-emitting element;
    a support member having the light-emitting element mounted thereto;
    a heat slag, the heat slag being non-electrically conductive;
    joining portions connected to the heat slag, the joining portions being joining surfaces adapted for solder balls, the joining portions defining gaps therebetween;
    solder balls connected to the joining portions, wherein the heat generated by the light-emitting element is conducted to the solder balls via the heat slag; and
    a thermally conductive filling material injected in the gaps between the joining portions, the thermally conductive filling material being connected to the heat slag via the joining portions, the thermally conductive filling material being connected to an electrode of the light emitting element, wherein the heat slag is disposed between the thermally conductive filling material and the light emitting element and the thermally conductive filling material conducts heat from the heat slag and an electrode of the light-emitting element.

2. The light source device according to claim 1, wherein the filling material comprises an electrically insulating material.

3. The light source device according to claim 2, wherein the electrically insulating material includes solid particles that have a thermal conductivity that is larger than that of air.

4. The light source device according to claim 3, wherein the electrically insulating material comprises an adhesive that contains ceramic filler as the solid particles.

5. The light source device according to claim 2, wherein the electrically insulating material comprises a solidified electrically insulating material.

6. The light source device according to claim 1, wherein the filling material comprises an electrically conductive material and an electrically insulating member that insulates between electrodes of the light-emitting element.

7. The light source device according to claim 6, wherein the electrically conductive material includes electrically conductive solid particles.

8. The light source device according to claim 7, wherein the electrically conductive material comprises any one of a metal paste, an adhesive containing metal filler as solid particles, and an anisotropically electrically conductive elastic body.

9. The light source device according to claim 1, wherein the light-emitting element comprises a light-emitting diode.

10. A projector, comprising:
a light source device according to claim 1 that projects illuminating light;
a light modulator illuminated by illuminating light from the light source device; and
a projection optical system projecting image light from the light modulator.

11. A projector, comprising:
a light source device for each color light according to claim 1 that emits illuminating light of each color;
a light modulator for each color that is illuminated by each illuminating light of the respective colors;
a light synthesizing member that synthesizes image light of color light from the light modulator of the respective colors; and
a projection optical system projecting image light that has undergone the light synthesizing member.

* * * * *